(12) United States Patent
Gaudin et al.

(10) Patent No.: US 8,384,171 B2
(45) Date of Patent: Feb. 26, 2013

(54) WRITABLE MAGNETIC ELEMENT

(75) Inventors: Gilles Gaudin, Le Sappey (FR); Ioan Mihai Miron, Mataro (ES); Pietro Gambardella, Sant Cugat Des Valles (ES); Alain Schuhl, Grenoble (FR)

(73) Assignees: Centre National de la Recherche Scientifique, Paris (FR); Commissariat a l'Energie Atomique Et Aux Energies Alternatives, Paris (FR); Universite Joseph Fourier, Grenoble Cedex (FR); Institut Catala de Nanotechnologia (ICN), Bellaterra (ES); Institucio Catalana de Recerca I Estudis Avancats (ICREA), Barcelona (ES)

(*) Notice: Subject to any disclaimer, the term of this patent is extended or adjusted under 35 U.S.C. 154(b) by 167 days.

(21) Appl. No.: 12/959,980

(22) Filed: Dec. 3, 2010

(65) Prior Publication Data

US 2012/0098077 A1 Apr. 26, 2012

(30) Foreign Application Priority Data

Oct. 26, 2010 (FR) ..................................... 10 04198

(51) Int. Cl.
*H01L 21/00* (2006.01)
(52) U.S. Cl. .......................... 257/421; 365/171; 365/173
(58) Field of Classification Search ................... 257/421; 365/171, 173
See application file for complete search history.

(56) References Cited

U.S. PATENT DOCUMENTS

| | | | | |
|---|---|---|---|---|
| 5,313,186 | A | * | 5/1994 | Schuhl et al. ............... 338/32 R |
| 5,378,683 | A | * | 1/1995 | Cabanel et al. ............... 505/190 |
| 6,291,993 | B1 | * | 9/2001 | Fert et al. ..................... 324/252 |
| 6,317,359 | B1 | | 11/2001 | Black et al. |
| 6,496,004 | B1 | * | 12/2002 | Nguyen Van Dau et al. . 324/252 |

(Continued)

FOREIGN PATENT DOCUMENTS

| | | |
|---|---|---|
| EP | 1 555 694 A1 | 7/2005 |
| EP | 1 610 386 A1 | 12/2005 |

(Continued)

OTHER PUBLICATIONS

Search Report for French Application No. FR 10 04 198, completed Jun. 6, 2011.

*Primary Examiner* — Laura Menz
(74) *Attorney, Agent, or Firm* — Alston & Bird LLP

(57) ABSTRACT

The invention relates to a writable magnetic element comprising a stack of layers presenting a write magnetic layer, wherein the stack has a central layer of at least one magnetic material presenting magnetization having a magnetization direction that is parallel to the plane of the central layer, which layer is sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, and wherein it includes a device to cause a write current to pass through the second outer layer and the central layer in a current flow direction parallel to the plane of the central layer at an angle α lying in the range 90°±60°, in particular 90°±30°, and more particularly 90°±15° relative to said magnetization direction in order to generate an effective magnetic field in the central layer, the current being applied either in a first direction or in a second direction opposite to the first, in order to orient the magnetization direction in a first magnetization direction or in a second magnetization direction opposite to the first.

33 Claims, 2 Drawing Sheets

U.S. PATENT DOCUMENTS

| | | | |
|---|---|---|---|
| 7,009,877 B1 | 3/2006 | Huai et al. | |
| 7,495,867 B2 * | 2/2009 | Sbiaa et al. | 360/324.11 |
| 7,602,178 B2 * | 10/2009 | Hehn et al. | 324/252 |
| 7,606,008 B2 * | 10/2009 | Sbiaa et al. | 360/324.11 |
| 7,656,621 B2 * | 2/2010 | Shimazawa et al. | 360/324.12 |
| 7,672,092 B2 * | 3/2010 | Tsuchiya et al. | 360/324.12 |
| 7,729,231 B2 * | 6/2010 | Gaudin et al. | 369/283 |
| 7,826,258 B2 * | 11/2010 | Zhu et al. | 365/171 |
| 7,935,435 B2 * | 5/2011 | Gao et al. | 428/811.1 |
| 7,936,598 B2 * | 5/2011 | Zheng et al. | 365/173 |
| 7,940,600 B2 * | 5/2011 | Dimitrov et al. | 365/230.07 |
| 8,036,070 B2 * | 10/2011 | Gaudin et al. | 369/13.38 |
| 8,040,641 B2 * | 10/2011 | Miyauchi et al. | 360/324.1 |
| 8,098,541 B2 * | 1/2012 | Dimitrov et al. | 365/230.07 |
| 8,287,944 B2 * | 10/2012 | Gao et al. | 427/128 |
| 8,288,023 B2 * | 10/2012 | Gao et al. | 428/811.1 |
| 2005/0135020 A1 * | 6/2005 | Sugita et al. | 360/324 |
| 2007/0002503 A1 * | 1/2007 | Sbiaa et al. | 360/324.11 |
| 2007/0030603 A1 * | 2/2007 | Sato et al. | 360/324 |
| 2007/0035888 A1 * | 2/2007 | Sbiaa et al. | 360/324.1 |
| 2007/0086120 A1 * | 4/2007 | Shimazawa et al. | 360/322 |
| 2007/0159164 A1 * | 7/2007 | Hehn et al. | 324/207.21 |
| 2009/0122658 A1 * | 5/2009 | Gaudin et al. | 369/13.17 |
| 2009/0128965 A1 * | 5/2009 | Mizuno et al. | 360/324 |
| 2009/0129143 A1 | 5/2009 | Guo et al. | |
| 2009/0130491 A1 * | 5/2009 | Ohta et al. | 428/811.2 |
| 2009/0213502 A1 * | 8/2009 | Miyauchi et al. | 360/319 |
| 2009/0237987 A1 * | 9/2009 | Zhu et al. | 365/171 |
| 2010/0232074 A1 * | 9/2010 | Machita et al. | 360/324.11 |
| 2011/0100953 A1 * | 5/2011 | Tanaka et al. | 216/22 |
| 2012/0018822 A1 * | 1/2012 | Gaudin et al. | 257/421 |
| 2012/0020152 A1 * | 1/2012 | Gaudin et al. | 365/171 |
| 2012/0098077 A1 * | 4/2012 | Gaudin et al. | 257/421 |

FOREIGN PATENT DOCUMENTS

| | | |
|---|---|---|
| FR | 2852399 A1 * | 9/2004 |
| WO | WO 9801764 A1 * | 1/1998 |
| WO | WO 9927379 A1 * | 6/1999 |
| WO | WO 0036429 A1 * | 6/2000 |
| WO | WO 2004083881 A1 * | 9/2004 |

* cited by examiner

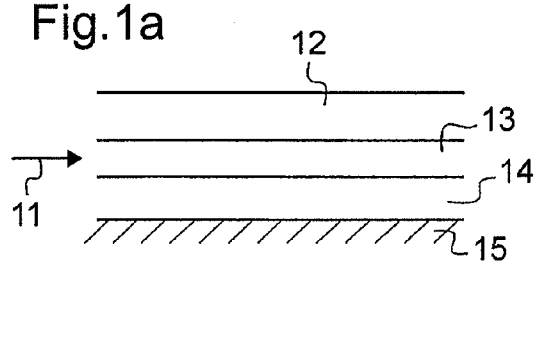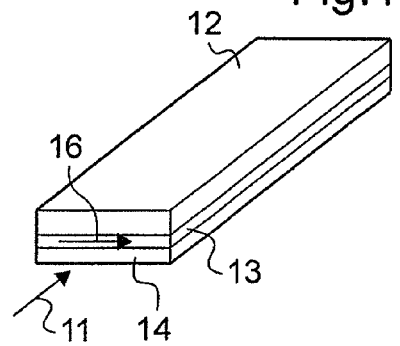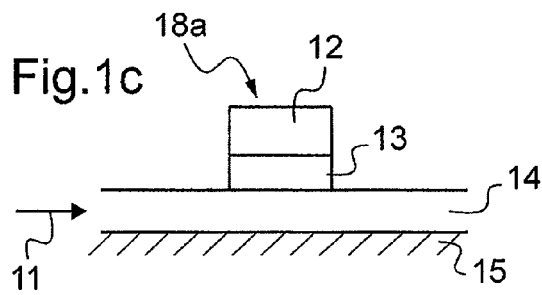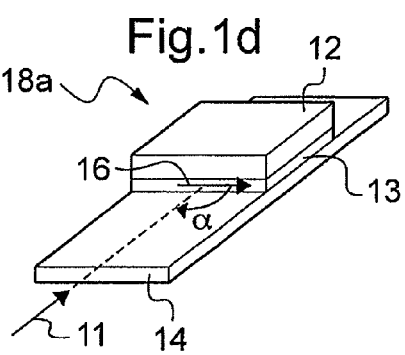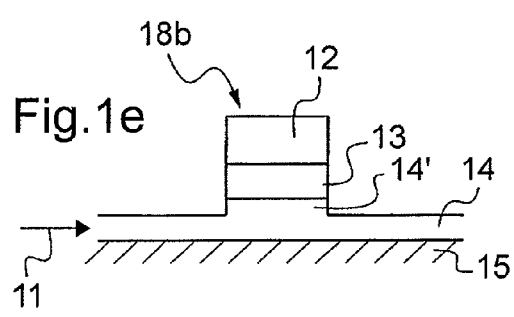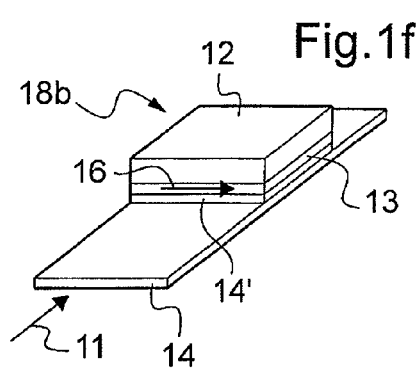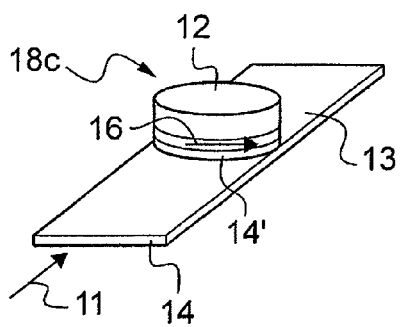

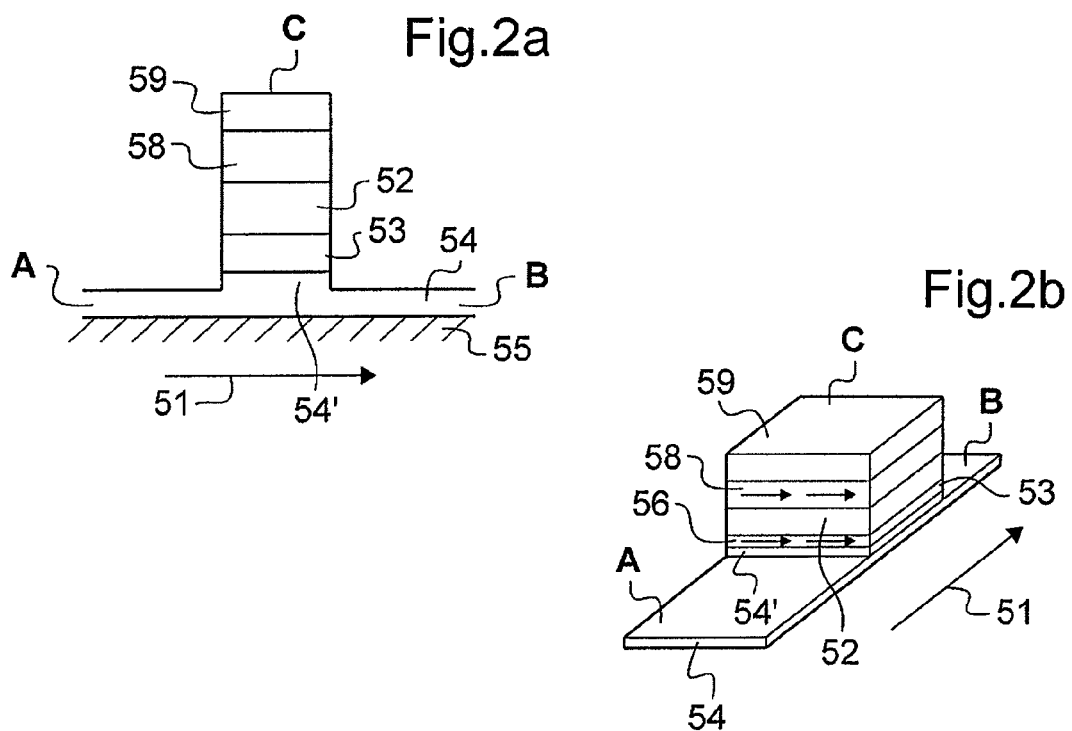
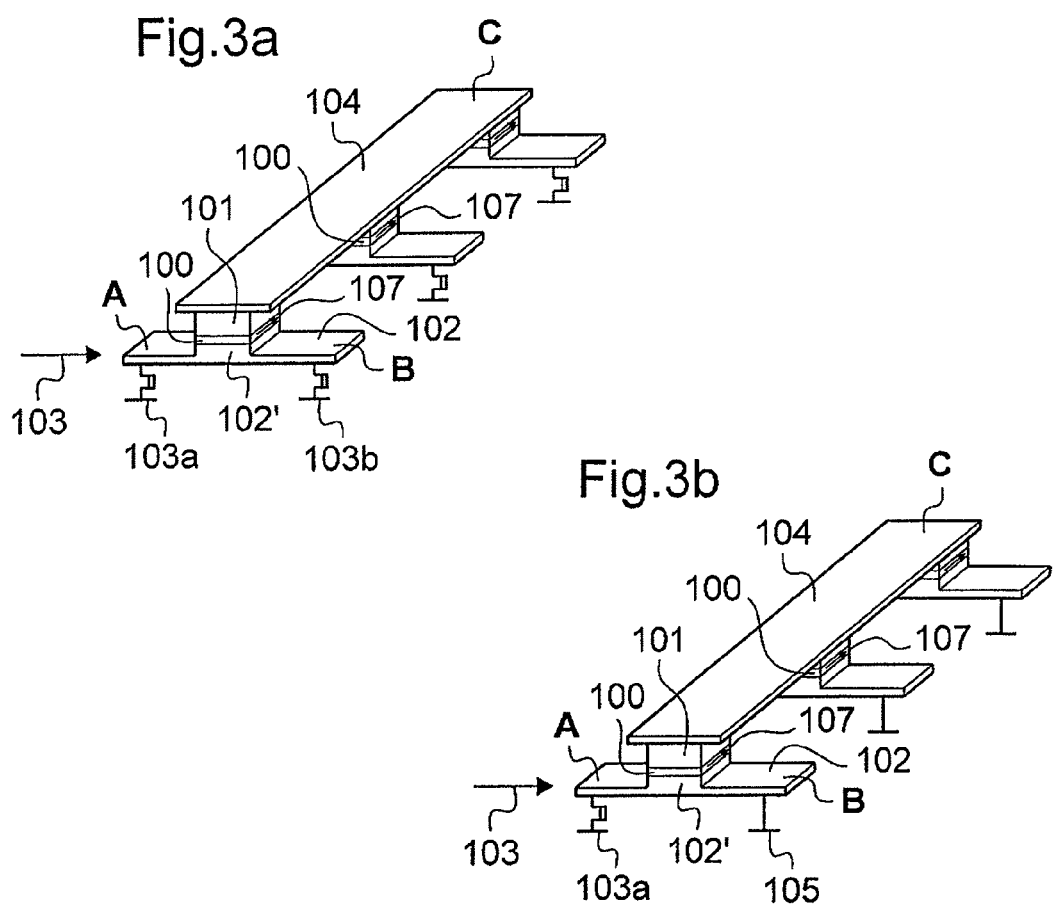

WRITABLE MAGNETIC ELEMENT

FIELD OF THE INVENTION

The present invention provides a writable magnetic element of the current-induced reversal type.

BACKGROUND OF THE INVENTION

The magnetization of a layer or of a small magnetic element is commonly reversed by means of an applied magnetic field. The direction of the field is changed depending on whether it is desired to turn the magnetization in one direction or in another for example. Writing on magnetic tracks or on computer hard disks is based on this principle: the element for reversing is placed mechanically in the vicinity of a magnetic field generator so as to localize the field in three dimensions. It is the very structure of a magnetic field, which by definition is not localized in three dimensions, that raises numerous difficulties for integrating magnetic fields in devices. Thus, when no mechanical action is possible or desired, e.g. with solid magnetic memories known as magnetic random access memory (MRAM) or with logic devices, it is necessary to focus the magnetic field sufficiently for it to act only on the target cell and without impacting its neighbors. This problem becomes increasingly severe when the various memory or logic cells are located very close to one another in order to increase the density thereof.

The possibility of manipulating magnetization by means of a spin-polarized current, which was initially demonstrated theoretically in 1996, has provided a first solution to this problem. For the purpose of manipulating the magnetization at a memory point, this physical principle referred to as spin transfer torque (STT) requires the presence of at least two magnetic layers separated by a non-magnetic metal (for a spin valve type structure) or by an insulator (for a magnetic tunnel junction type structure), the two layers having magnetizations that are not colinear. The detailed physical explanation differs depending on whether a spin valve structure or a magnetic tunnel junction structure is involved, but in outline the current becomes spin polarized on passing through the first magnetic layer and then exerts torque on the magnetization of the second layer by means of the non-colinear component of the current polarization. When current densities are high enough, the magnetization of the second magnetic layer may be reversed both in spin valves and in magnetic tunnel junctions.

As described for example in U.S. Pat. No. 7,009,877 published on Mar. 7, 2006 and in US patent application No. 2009/129143 published on May 21, 2009, the electric current necessarily passes through the junction perpendicularly to the plane of the layers.

This ability to manipulate locally the magnetization of a magnetic element of sub-micrometer size by means of an electric current immediately opens up possibilities for applications. At present, industrial actors are seeking to incorporate this principle in novel architectures for MRAM memory cells and logic components.

At present, such incorporation encounters various difficulties that appear to be inter-related.

Reversal by STT requires the presence at the memory point of at least two magnetic layers that are separated by a non-magnetic spacer. As described above, writing is performed by injecting a high-density current through the entire stack perpendicularly to the plane of the magnetic layers, while reading is performed by means of the magnetoresistance of the stack: giant magnetoresistance (GMR) for spin valves, and tunnel magnetoresistance (TMR) for magnetic tunnel junctions. At present, all or nearly all applications are based on using magnetic tunnel junctions. Thus although the GMR signal is only a few percent, the TMR signal from MgO-based junctions is commonly greater than 100%. Nevertheless, tunnel junctions have the disadvantage of presenting large values for the product of resistance multiplied by area (RA). Thus, for a typical current density of $10^7$ amps per square centimeter ($A/cm^2$) as needed for STT reversal, the voltage at the edges of the junction is 10 volts (V) for an RA of 100 ohm-square micrometers ($\Omega \cdot \mu m^2$), 1 V for an RA of 10 $\Omega \cdot \mu m^2$, and 0.1 V for an RA of 1 $\Omega \cdot \mu m^2$. Apart from the smallest value, the power dissipated in the junction is then large, which is harmful both in terms of energy consumption and in terms of damaging said junction. Furthermore, the high values of TMR that are useful in reading are often obtained by stacks that present high values for RA. That is why present research is seeking to obtain tunnel junctions that present high values of TMR and small values of RA. In addition, even for relatively small values of voltage at the edges of the junction, accelerated aging phenomena of the junction have been observed in operation that are due to voltage cycling. At present, numerous studies are devoted to this point both for optimizing materials in existing configurations and also for defining new configurations which make it possible to decouple the write and read problems as much as possible, by using configurations having three terminals, for example.

To summarize, a difficulty lies in the impossibility of independently optimizing reading and writing since, in known STT devices, those two phenomena are intrinsically linked.

Yet another difficulty that is inherent to this link comes from the ever-greater complexity of the stacks. Thus, if it is desired that the STT effect is felt only in the layer that is to be reversed in order to store the magnetization, it is necessary for example to stabilize the other layers, e.g. by means of exchange coupling with an antiferromagnetic material: if it is desired to increase the amplitude of the STT transfer, it is necessary to optimize the polarizing layers; if it is desired to reduce the magnetic fields radiated on the sensitive layers, it is necessary for example to use artificial antiferromagnetic bilayers; etc.

As a result, typical magnetic stacks of MRAM cells or logic components may have more than ten or 15 different layers of various materials. This then gives rise to difficulties during structuring steps, and in particular during the etching step, which is one of the major blocking points for integrating such magnetic stacks.

Another line of research is to manipulate the magnetization by means of a local electric field. This may be accomplished in part by modifying the anisotropy of a material by means of an outer electric field, with magnetization being reversed by means of an applied magnetic field. One such technique is described in the article by T. Maruyama et al. entitled "Large voltage-induced magnetic anisotropy charge in a few atomic layers of iron" (Nature Nanotechnology, Vol. 4, March 2009—Macmillan Publishers Ltd.).

At present, that technique makes it possible only to reduce the magnetic anisotropy of the material. The write and read processes are then the same as those described previously, and they have the same drawbacks.

SUMMARY OF THE INVENTION

The present invention provides a writable magnetic element that, in order to invert magnetization, does not require the presence of a magnetic layer (having magnetization parallel to its plane), and that operates without the stack passing a write current perpendicularly to the planes of the layers.

The invention thus provides a writable magnetic element comprising a stack of layers presenting a write magnetic layer, wherein the stack has a central layer of at least one magnetic material presenting magnetization having a magnetization direction that is parallel to the plane of the central layer, which layer is sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, and wherein it includes a device to cause a write current to pass through the second outer layer and the central layer in a current flow direction parallel to the plane of the central layer at an angle α lying in the range 90°±60°, in particular 90°±30°, and more particularly 90°±15° relative to said magnetization direction in order to generate an effective magnetic field (or spin-orbit field) in the central layer, the current being applied either in a first direction or in a second direction opposite to the first, in order to orient the magnetization direction in a first magnetization direction or in a second magnetization direction opposite to the first.

The present invention presents the important additional advantage of enabling write operations to be performed without an external magnetic field being applied.

The effective magnetic field (or spin-orbit magnetic field) is due to the Rashba field and to the s-d exchange interaction acting on the local magnetization, as explained below in the present description.

The idea on which the invention is based is to use the spin-orbit magnetic field to manipulate the magnetization of the magnetic layer. According to the invention, this is achieved without needing an applied magnetic field, by orienting the magnetization of the magnetic layer preferably colinearly with the direction of the spin-orbit magnetic field, which direction is determined by the configuration of the stack, of the interfaces, and of the current flow direction. The write current flow direction is preferably perpendicular to said magnetization direction.

The write electric current flows parallel to the magnetic layer and does not pass through the stack in a direction perpendicular to the planes of the layers, and it is possible to write or erase the memory by acting on the flow direction of said current, and more particularly by applying a current pulse, without there being any need to apply an external magnetic field.

Advantageously, the central layer has thickness lying in the range 0.1 nanometers (nm) to 5 nm, and preferably less than or equal to 3 nm.

Advantageously, the central layer comprises a metal or metal alloy presenting planar magnetic anisotropy in the stack, in particular Co, Ni, Fe, $Co_xFe_y$, $Ni_xFe_y$, $Co_xNi_y$, etc. . . . , the magnetization of this central layer being contained in the plane of the central layer.

Advantageously, at least one outer layer is electrically conductive and is made of a non-magnetic metal such as Pt, W, Ir, Ru, Pd, Cu, Au, Ag, Bi, or of an alloy of said metals, or indeed is made of a highly doped semiconductor material ($^{++}$doping) such as Si, Ge, or GaAs. By way of example, the thickness of a said electrically conductive outer layer lies in the range 0.5 nm to 100 nm, and more particularly in the range 1 nm to 10 nm, and is preferably less than or equal to 5 nm. Both outer layers may be electrically conductive, and are made of two different ones of said non-magnetic alloys or materials. The thickness of a conductive outer layer is unrelated to the thickness of the central layer.

When the first outer layer is electrically non-conductive, it is advantageously made of a dielectric oxide, preferably $SiO_x$, $AlO_x$, $MgO_x$, $TiO_x$, $TaO_x$, ZnO, $HfO_x$, or a dielectric nitride such as $SiN_x$, $Bn_x$, or indeed a semiconductor (e.g. Si, Ge, or GaAs) that is intrinsic or very lightly doped so that its resistivity is greater than 0.1 Ω·cm (i.e. a doping level that is typically less than $10^{16}$ doping atoms per cubic centimeter (/cm$^3$) for Si or Ge) and preferably greater than 1 Ω·cm. By way of example, the thickness of this outer layer lies in the range 0.5 nm to 200 nm, particularly in the range 0.5 nm to 100 nm. More particularly it lies in the range 0.5 nm to 5 nm, and is preferably less than 3 nm, in particular if the memory element is read by means of a tunnel magnetoresistance signal. In any event, the thickness of this layer is unrelated to the thickness of the central layer.

By way of example, the write current presents current density lying in the range $10^4$ A/cm$^2$ to $10^9$ A/cm$^2$, and preferably in the range $10^5$ A/cm$^2$ to $10^8$ A/cm$^2$.

The first outer layer may be covered by a read layer made of magnetic material, and by a read electrode.

A device may be coupled to the read electrode in order to cause a read current to pass through the stack as formed in this way and in order to measure the resistance across the terminals of the stack.

When the first outer layer is made of a non-magnetic metal, it co-operates with the central layer, the read layer, and the read electrode to form a spin valve. The thickness of the first outer layer then lies in the range 0.5 nm to 10 nm and is preferably less than 5 nm.

When the first outer layer is dielectric, it co-operates with the central layer, the read layer, and the read electrode to form a magnetic tunnel junction. Under such circumstances, the thickness of the first outer layer lies in the range 0.5 nm to 5 nm, and is preferably less than 3 nm.

The first outer layer and the central layer advantageously form a stud. The second outer layer may include a region of extra thickness forming a portion of the stud. A track is advantageously formed either by the second outer layer or by an electrically conductive track that borders the second outer layer.

The invention also provides a writable magnetic device comprising a plurality of studs as defined above, and the second outer layer includes a said track which is common to the studs.

Finally, the invention also provides a writable magnetic device, wherein the first outer layer, the central layer, and a region of extra thickness constituting the second outer layer form a stud, and wherein it includes a plurality of said studs together with an electrically conductive track bordering the second outer layers of said studs in order to inject said current through said second outer layers and the central layers of each of said studs, the second outer layers being made of an electrically conductive material that is different from the material of the electrically conductive track.

BRIEF DESCRIPTION OF THE DRAWINGS

The invention can be better understood on reading the following description with reference to the drawings, in which:

FIGS. 1a to 1g show implementations of the invention;

FIGS. 2a and 2b showing an embodiment integrated in an MRAM type magnetic memory cell; and FIGS. 3a and 3b showing embodiments in each of which a plurality of memory elements are shown to illustrate the architecture of the memory.

DETAILED DESCRIPTION

The stack implemented in the context of the present invention, i.e. a central magnetic layer sandwiched between two outer layers that are not magnetic, and at least one of which is conductive, the two outer layers being of different materials, has the effect of creating inversion asymmetry that generates a non-compensated electric field in the magnetic central layer. The electrons propagating in this electric field are subjected in their own frame of reference to a magnetic field known as the Rashba field $\vec{H_R}$. The Rashba field $\vec{H_R}$ is perpendicular both to the current flowing in the conductive layer and to the electric field. This magnetic field is thus applied to the conduction electrons.

The inventors have shown that an effective magnetic field (also referred to as spin-orbit magnetic field) resulting from the Rashba field and the s-d exchange interaction coupling the spin of the itinerant and localized electrons is applied on the local magnetization.

The article by Ioan Mihai Miron et al. entitled "Current-driven spin torque induced by the Rashba effect in a ferromagnetic metal layer", and published in Nature Materials/Advance Online Publications, Vol. 9, pages 230-234 in March 2010 (Macmillan Publishers Ltd.), shows that a stack having a 3 nm thick layer of Pt, a 0.6 nm thick layer of Co having magnetization perpendicular to its plane and thus parallel to the z axis, and a 2 nm thick layer of $AlO_x$ conveying a current flowing parallel to the x axis. That stacking presents an effective magnetic field $H_{eff}$ (or spin-orbit magnetic field) along the third axis of the reference frame, the y axis. That configuration is thus inappropriate for making a memory since the magnetic field is perpendicular to the magnetization of the magnetic layer.

Surprisingly, the inventors have shown that this theoretical obstacle can be overcome in a configuration that is different from that described in the above-mentioned article by allowing the magnetization of the magnetic layer to have an orientation that is preferably colinear with the direction of the effective magnetic field generated by the current. When a write current is injected into the central layer, but perpendicularly to the direction of magnetization that, in the present configuration, lies in the plane of the magnetic central layer, a spin-orbit field is generated that is colinear with the direction of the magnetization, and a reversal of the direction of the magnetization may be obtained according to the invention as a function of the flow direction of the injected write current, without applying an external magnetic field. This reversal of the magnetization continues to be obtained in the invention when the flow direction of the current in the plane of the central layer is not perpendicular to the direction of magnetization, but forms an angle α relative thereto lying in the range 90°±60°, in particular in the range 90°±30°, and more particularly in the range 90°±15°. The effective magnetic field retains a component that is colinear with the magnetization direction of the central layer.

In FIGS. 1a to 1g, reference 15 designates a substrate that is an electrical insulator, so as to avoid short-circuiting the structure. It may be constituted in particular by a dielectric oxide ($SiO_2$, $AlO_x$, $MgO_x$, $TiO_x$, $TaO_x$, ZnO, HfO), or by a nitride, e.g. $SiN_x$. It may be on its own or it may be deposited on another substrate, e.g. of silicon.

Reference 13 designates the plane magnetic layer of magnetization that is parallel to its plane. Reference 16 designates the orientation of the magnetization that is contained in the plane of the magnetic layer 13.

References 14 and 12 designate the non-magnetic outer layers.

Reference 11 designates the direction of the write current that is parallel to the plane of the layer 13, but that is perpendicular to the magnetization in this example. As mentioned above, the direction of the current may form an angle α (FIG. 1d) lying in the range 90°±60° (30°<α<150°), 90°±30° (60°<α<120°), and more particularly 90°±15° (75°<α<105°) relative to the direction 16 of the magnetization.

FIGS. 1a and 1b show a non-structured stack in which the layers 12, 13, and 14 of the stack form a track.

The magnetization direction 16 in this example is perpendicular to the longitudinal direction of the track that constitutes the conductive layer 14 into which the current is injected.

FIGS. 1c to 1g show a structured stack in which the layer 14 (referred to as the second outer layer) is conductive and the magnetic and non-magnetic layers 13 and 12 (referred to as the first outer layer) are the only layers that are structured in order to form studs 18a (FIGS. 1c and 1d), or else in which all three layers 12, 13, and 14 are structured so as to constitute a stud 18b or 18c incorporating an optional extra thickness 14' of the conductive layer 14 (FIG. 1e to 1g), such that the stud 18b or 18c contains a portion of the thickness of the non-magnetic material of the layer 14.

The thickness to be taken into account for the second outer layer is then the thickness of the layer 14 proper plus the extra thickness 14'.

It should be observed that the region 14' of extra thickness is not necessarily made of the same electrically conductive material as the layer 14, in which case it is the extra thickness 14' on its own that acts as the non-magnetic second outer layer and it is its material that is functional in the stack to obtain inversion asymmetry. The metal material of the layer 14 may then be arbitrary.

The formation of studs 18a, 18b, or 18c serves to reverse the magnetization in the studs only, otherwise the magnetization is reversed over the entire length of the track (FIGS. 1a and 1b).

The direction 16 of magnetization in the studs 18a to 18c is preferably perpendicular to the longitudinal axis of the conductive track 14, which direction is parallel to the current flow direction 11. To obtain such a direction of magnetization that is colinear with the direction of the spin-orbit field, it is possible for example to make a stud that is elliptical, e.g. 18c, with its long axis perpendicular to the longitudinal axis of the conductive track 14 (the extra thickness 14' is optional) in order to obtain shape anisotropy in the desired direction.

The magnetic layer 13 presents a direction of magnetization situated in its plane and it is of thickness that is sufficiently small for the electric field due to the interfaces to be non-negligible. Its thickness typically does not exceed 3 nm and it is at most 5 nm. Any magnetic material presenting planar magnetization (Co, Fe, Ni, $Co_xFe_y$, $Ni_xFe_y$, $Co_xNi_y$, etc.) may be used. It is also possible to make use of non-metallic magnetic materials such as, for example, magnetic semiconductors such as GaMnAs (Mn-doped GaAs), InMnAs, $Mn_xGe_{1-x}$, doped ZnO, or indeed $TiO_x$.

The two non-magnetic layers 12 and 14 need to be different in order to create inversion asymmetry in the overall structure. Two different materials are selected for these respective layers, e.g. a dielectric material for one of the two and a metal for the other one, however it is also possible to select a metal for each of them. The situation in which both layers 12 and 14 are electrically non-conductive is possible only when studs are not structured, i.e. when there is a track. The current then flows in the central layer 13, which constitutes a track.

Thus, each of the two non-magnetic layers 12 and 14 may be constituted out of the following materials, on the condition that these layers are different so that the stack 12, 13, 14 presents inversion asymmetry: a dielectric oxide ($SiO_x$, $AlO_x$, $MgO_x$, $TiO_x$, $TaO_x$, ZnO, $HfO_x$, . . . ); a dielectric nitride ($SiN_x$, $Bn_x$, . . . ); a non-magnetic metal (Pt, Pd, Cu, Au, Bi, Ir, Ru, W, . . . ); a non-magnetic alloy of these metals; an organic or non-organic semiconductor compound (e.g. optionally-doped GaAs, Si, Ge); or graphene, bonded if necessary to a growth buffer, e.g. a metal (such as Ir, Ru, Ni); or a semiconductor compound such as SiC.

By way of example a layer that is not electrically conductive is made of a semiconductor material (e.g. Si, Ge, GaAs) that is intrinsic or lightly doped so that its resistivity is greater than 0.1 Ω·cm (which corresponds to a doping level that is typically less than $10^{16}/cm^3$ for Si or Ge), and that is preferably greater than 1 Ω·cm.

For an electrically conductive layer of semiconductor material, it is appropriate to provide a highly doped semiconductor ($^{++}$doping), for example Si or Ge having a carrier density of $10^{18}/cm^3$, or more.

When one or other of the non-magnetic layers is conductive, the two outer layers must not have the same composition.

The thickness of the layers 12 and 14 may be selected over a wide range of values, typically 0.5 nm to 200 nm in thickness, and more particularly 0.5 nm to 100 nm. Nevertheless, when using metal layers 12 and/or 14, it is preferable to use layers that are fine, typically having thickness of less than 5 nm and generally of less than 10 nm, so as to avoid excessively reducing the effective current passing through the magnetic layer because of the parallel conductive channels. With insulating layers, the layers may be thick, e.g. up to about 200 nm in thickness, unless the stack is integrated in a memory that is read by a magnetic tunnel junction (TMR), in which case its thickness should typically be less than 3 nm.

These various layers may be deposited by any known technique such as: evaporation, sputtering, electrochemical deposition, chemical growth, . . . .

The layer 14 may be omitted in certain configurations. The magnetic layer 13 is then deposited directly on the insulating substrate 15 (which acts as a non-magnetic layer) and the non-magnetic layer 12 is made of a material that is different from that constituting the substrate 15 and selected so that the stack presents inversion asymmetry. It should nevertheless be observed that when studs are structured, the layer 14 must be present and constituted by an electrically conductive material so as to be able to inject current into the structured studs (here 18a and 18b).

The element for reversing, whether it is the track shown (FIG. 1a or 1b) or a stud structured in or fitted on the track (FIG. 1c to 1g), is connected by conventional conductive electrodes so as to inject a write current in the direction 11. Current densities may lie in the range $10^4$ $A/cm^2$ to $10^9$ $A/cm^2$, and more particularly in the range $10^5$ $A/cm^2$ to $10^8$ $A/cm^2$. The write current does not pass perpendicularly through the layers of the stack (12, 13, 14), and it is only the read current of much smaller magnitude that passes perpendicularly through the layers.

Injecting current into the track 14 in the direction of arrow 11 (or in the opposite direction) enables the magnetization of the layer 13 to be switched by means of the effective magnetic field produced on magnetization by the spin-orbit interaction and the exchange coupling. The magnetization is oriented in the plane of the magnetic central layer 13, and in this example it is oriented perpendicularly to the current injection direction. The effective magnetic field is parallel to the magnetization, thereby enabling memory points to be written by reversing the magnetization as a function of the direction in which current is injected.

If the magnetization direction of the central layer is not perpendicular to the current injection direction, writing remains possible so long as the directions are not colinear, since the effective magnetic field retains a component that is colinear with the magnetization direction of the layer. An angle α is selected between the current injection direction and the magnetization direction that lies in the range 90°±60°, in particular 90°±30°, and more particularly 90°±15°.

When α is not equal to 90°, the spin-orbit magnetic field aligns the magnetization onto itself during application of the write current. The magnetization returns to its previous axis, but in the opposite direction when the write current pulse stops. By changing the direction of the write current, the axis of magnetization is conserved but its direction is inverted.

FIGS. 2a and 2b show an example of a stack suitable for use in an MRAM memory cell.

Reference 53 designates the magnetic central layer sandwiched between two different non-magnetic materials 52 and 54 with an (optional) extra thickness 54', so as to form a stack as described above on an electrically insulating substrate 55.

Reference 51 designates the current flow direction in the track 54, and reference 56 designates the direction of magnetization in the layer 53, which in this example is perpendicular to the current injection direction.

For reading purposes there are placed above the stack a layer 58 of a magnetic material and a top electrode 59 that may contain one or more conductive layers (that may be magnetic or non-magnetic).

The function of the layer 58 is to enable the structure 53, 52, and 58 to present different electrical resistance values depending on the direction of the magnetization 56 of the layer 53 (magnetoresistance signal). It is involved only for reading and has no effect on manipulating the magnetization of the layer 53.

In other words, writing and reading are defined independently and may be optimized separately.

The electrode 59 may comprise one layer or it may in conventional manner comprise a stack of different functional layers. For example it may contain:

a stack defining synthetic antiferromagnetism so as to limit the fields radiated onto the layer 53 that is to be manipulated, e.g. a stack comprising a ferromagnetic layer separated from the ferromagnetic layer 58 by a very fine layer of a non-magnetic metallic material, typically 0.3 nm of ruthenium (Ru), the values of the magnetizations of the two ferromagnetic layers being as close to each other as possible so that the antiferromagnetic coupling between them that is due to the presence of the ruthenium layer results in the total field as radiated by these three layers on the layer 53 being zero or practically zero;

or else an antiferromagnetic magnetic material coupled by exchange with the layer 58 so as to stabilize this so-called "reference" layer 58;

or else non-magnetic conductive materials for making electrical contacts;

or indeed a combination of those various possibilities, e.g. an antiferromagnetic material adjacent to a ferromagnetic material so as to stabilize the magnetization thereof by coupling between these two materials, the ferromagnetic material being separated from the layer 58 by a fine metallic layer, typically 0.3 nm of Ru, so that the magnetic coupling between these two ferromagnetic layers is antiferromagnetic. Finally, the first magnetic material is covered in one or more non-magnetic conductive layers, e.g. 5 nm of Ta covered in 7 nm of Ru. Examples of such combinations can be found for example in the magnetic stacks used for STT reversal as described by B. Dieny et al., Int. J. Nanotechnology, Vol. 7, 591 (2010).

Two main configurations may be distinguished depending on the nature of the non-magnetic layer 52: if it is of non-magnetic metal, then the structure 53, 52, and 58 is of the spin valve type, whereas if the layer 52 is dielectric, then the structure 53, 52, and 58 is of the magnetic tunnel junction type. Since the magnetoresistance signal is much stronger for these structures, these are the preferred structures. Similarly, in order to optimize the magnetoresistance signal, in both configurations it is preferred for the magnetization of the layer 58 to be colinear, i.e. parallel or anti-parallel to that of the layer 53. When the layer 52 is electrically conductive, e.g. being made of a non-magnetic metal, its thickness is advantageously less than 10 nm, and preferably less than 5 nm, whereas when the layer 52 is dielectric, its thickness is advantageously less than 5 nm, and preferably less than 3 nm.

In FIGS. 2a and 2b, A, B, and C designate three electrical connection terminals. During the write stage, a current is injected between the terminals A and B (or in equivalent manner, a voltage is applied between these terminals so as to cause a current to flow). The current passes through the magnetic layer 53 and in said layer it produces an effective magnetic field due to the Rashba field and to the s-d exchange interaction acting on the local magnetization (see the above-mentioned article by Ioan Mihai Miron et al.). This effective field $H_{eff}$ is referred to in equivalent manner as the spin-orbit magnetic field or as the effective field $H_{eff}$. This spin-orbit field created by the applied write current makes it possible, according to the invention, to manipulate the magnetization. When the layer 52 is constituted by a dielectric material, the laterally-injected write current does not pass through said layer and does not damage it. Once the write current has been interrupted, the magnetization direction is conserved.

The stored information, typically the orientation of the magnetization in the central layer 53 is read both for a tunnel junction type structure and for a spin valve type structure by injecting a low value read current (e.g. of the order of a few microamps (µA) to a few tens of µA for a tunnel junction) between the terminals C and B (or in equivalent manner between the terminals C and A), and by measuring the voltage between these terminals; or else by applying a constant voltage between the terminals B and C (or in equivalent manner between the terminals A and C), and measuring the current that flows between these terminals so as to measure in all cases the resistance between said terminals. The resistance presents two different values depending on the magnetization of the layer 53 is parallel or anti-parallel to the magnetization of the reference layer 58. The read current has a low value so that the tunnel barrier (when the layer 52 is dielectric) is not damaged.

Examples of memory architectures are described below with reference to FIGS. 3a and 3b.

There can be seen the magnetic layer 100 with a magnetization direction 107 contained in the plane of the layer 100 (corresponding to the layers 13 and 53 in FIGS. 1c to 1g, 2a and 2b) sandwiched between two non-magnetic layers 101 and 102 (which correspond to the layers 12 and 14 of FIGS. 1a and 1f, and 52 and 54 of FIGS. 2a and 2b). The studs may present a region of extra thickness 102' (corresponding of the regions 14' and 54' in FIGS. 1c to 1g, 2a and 2b). This region 102' is conductive and forms part of the electrically conductive track 102, when it is made out of the same material as the track, or else it constitutes a second non-magnetic layer when it is made of a different material.

Here, in order to simplify, the layer 101 comprises both said layer 12 or 52, and also magnetic and non-magnetic layers enabling a tunnel junction type stack to be defined (also known as a spin valve), and thus making it possible to read the magnetization state of the layer 100 (like the layers 52, 58, and 59 in FIGS. 2a and 2b).

The magnetization of the layer 100 is reversed by current passing through the bottom electrode 102 and the central magnetic layer 100.

To do this, the second non-magnetic layer 102 constituting the sandwich is structured in the form of a current feed track. This track may also be constituted for example by another layer of another material situated under the layer 102.

Current injection is controlled by one or two transistors (for each stud).

Two situations may be taken as examples: either two transistors 103a and 103b are used that operate as switches, being connected by tracks (not shown) either to ground potential or to a voltage selected to cause the desired current to flow (FIG. 3a), or else there is only one transistor 103a, with the other end 105 (point B) of the track 102 being connected to a track that is taken to a constant potential (FIG. 3b).

For a given memory point, write current may be injected in two different variants.

In a first variant, two transistors 103a and 103b are used that operate as switches, with the free terminals thereof being connected to ground for one of them and to a voltage $V_{dd}$ for the other, with the voltage $V_{dd}$ being selected so as to cause a current of the selected value to flow in one direction or the other depending on which one of the transistors 103a and 103b is connected to the voltage $V_{dd}$.

In a second variant, only one transistor 103a is used, with the other end of the track 102 being connected at 105 to a constant voltage. In this event, two operating modes are thus possible:

Symmetrical Operation:

The track connected to the transistor 103a is connected to the potential $V_{dd}$ (or to ground) while the other track connected to the end of the track 102 at 105 is connected to ground (or to $V_{dd}$). This configuration enables a greater current to be generated than the following configuration; and Asymmetrical Operation:

The conductive track connected to the end of the track 102 at 105 is connected to an intermediate potential, e.g. $V_{dd}/2$, while the track connected to the transistor 103a is taken respectively to the potential $V_{dd}$ or to ground depending on the desired current direction. This configuration enables less current to be generated. In the configuration of the invention, the write current may be delivered to an area that is much smaller than the areas used in conventional techniques, and said current suffices to make the device operate. In this embodiment, operation consumes less electricity.

In both variants, regardless of whether operation is symmetrical or asymmetrical, inversion of the write current direction enables memory points to be written.

What is claimed is:

1. A writable magnetic element comprising a stack of layers presenting a write magnetic layer, wherein the stack has a central layer of at least one magnetic material presenting magnetization having a magnetization direction that is parallel to a plane of the central layer, which central layer is sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, and wherein it includes a device to cause a write current to pass through the second outer layer and the central layer in a current flow direction parallel to the plane of the central layer at an angle α lying in the range 90°±60° relative to said magnetization direction in order to generate an effective magnetic field in the central layer, the current being applied either in a first direction or in a second direction opposite to the first direction, in order to orient the magnetization direction in a first magnetization direction or in a second magnetization direction opposite to the first magnetization direction.

2. A magnetic element according to claim 1, wherein the current direction is perpendicular to said magnetization direction.

3. A magnetic element according to claim 1, wherein the central layer has thickness lying in the range 0.1 nm to 5 nm.

4. A magnetic element according to claim 1, wherein the central layer comprises a metal or metal alloy presenting planar magnetic anisotropy in the stack.

5. A magnetic element according to claim 1, wherein at least one outer layer is electrically conductive and is made of a non-magnetic metal, or is made of a highly doped semiconductor material.

6. A magnetic element according to claim 5, wherein the thickness of a said electrically conductive outer layer lies in the range 0.5 nm to 100 nm.

7. A magnetic element according to claim 5, wherein both outer layers are electrically conductive, and are made of two different ones of said non-magnetic alloys or materials.

8. A magnetic element according to claim 1, wherein the first outer layer is electrically non-conductive, and in particular is made of a dielectric oxide or a dielectric nitride.

9. A magnetic element according to claim 1, wherein the first outer layer is a semiconductor, that is intrinsic or lightly doped, presenting resistivity greater than 0.1 Ω·cm.

10. A magnetic element according to claim 8, wherein the thickness of a said dielectrically non-conductive first outer layer lies in the range 0.5 nm to 200 nm.

11. A magnetic element according to claim 1, wherein the write current presents current density lying in the range $10^4$ A/cm$^2$ to $10^9$ A/cm$^2$.

12. A magnetic element according to claim 1, wherein the first outer layer is covered by a read layer made of magnetic material, and by a read electrode.

13. A magnetic element according to claim 12, wherein the first outer layer is made of non-magnetic metal, wherein it co-operates with the central layer, the read layer, and the electrode to form a spin valve, and wherein the thickness of the first outer layer lies in the range 0.5 nm to 10 nm.

14. A magnetic element according to claim 12, wherein the first outer layer is electrically non-conductive, wherein it co-operates with the central layer, the read layer, and the read electrode to form a magnetic tunnel junction, and wherein the thickness of the first outer layer lies in the range 0.5 nm to 5 nm.

15. A magnetic element according to claim 1, wherein at least the first outer layer and the central layer form a stud.

16. A magnetic element according to claim 15, wherein the second outer layer includes a region of extra thickness that forms a portion of the stud.

17. A writable magnetic device, comprising a plurality of studs according to claim 15, and wherein the second outer layer includes a track that is common to the studs.

18. A writable magnetic device, wherein the first outer layer, the central layer, and a region of extra thickness constituting the second outer layer form a stud according to claim 16, and wherein it includes a plurality of said studs together with an electrically conductive track bordering the second outer layers of said studs in order to inject said current through said second outer layers and the central layers of each of said studs, the second outer layers being made of an electrically conductive material that is different from the material of the electrically conductive track.

19. A writable magnetic element according to claim 1, wherein said angle α lies in the range 90°±30° relative to said magnetization direction.

20. A writable magnetic element according to claim 1, wherein said angle α lies in the range 90°±15° relative to said magnetization direction.

21. A magnetic element according to claim 3, wherein the central layer has thickness lying less than or equal to 3 nm.

22. A magnetic element according to claim 4, wherein said metal or metal alloy presenting planar magnetic anisotropy is chosen among Co, Ni, Fe, Co$_x$Fe$_y$, Ni$_x$Fe$_y$, Co$_x$Ni$_y$.

23. A magnetic element according to claim 5, wherein said non-magnetic metal is chosen among Pt, W, Ir, Ru, Pd, Cu, Au, Ag, Bi, or of an alloy of said metals.

24. A magnetic element according to claim 6, wherein the thickness of a said electrically conductive outer layer lies in the range 1 nm to 10 nm.

25. A magnetic element according to claim 6, wherein the thickness of a said electrically conductive outer layer is less than or equal to 5 nm.

26. A magnetic element according to claim 8, wherein said first outer layer is made of a material chosen among SiO$_x$, AlO$_x$, MgO$_x$, TiO$_x$, TaO$_x$, ZnO, HfO$_x$, SiN$_x$, Bn$_x$.

27. A magnetic element according to claim 9, wherein the first outer layer is a semiconductor chosen among Si, Ge, or GaAs.

28. A magnetic element according to claim 9, wherein the first outer layer is a semiconductor presenting resistivity greater than 1 Ω·cm.

29. A magnetic element according to claim 10, wherein the thickness of a said dielectrically non-conductive first outer layer lies in the range 0.5 nm to 100 nm.

30. A magnetic element according to claim 10, wherein the thickness of a said dielectrically non-conductive first outer layer is less than 3 nm.

31. A magnetic element according to claim 11, wherein the write current presents current density lying in the range $10^5$ A/cm$^2$ to $10^8$ A/cm$^2$.

32. A magnetic element according to claim 13, wherein the thickness of the first outer layer lies in the range 0.5 nm to 5 nm.

33. A magnetic element according to claim 14, wherein the thickness of the first outer layer is less than 3 nm.

* * * * *

UNITED STATES PATENT AND TRADEMARK OFFICE
CERTIFICATE OF CORRECTION

| | |
|---|---|
| PATENT NO. | : 8,384,171 B2 |
| APPLICATION NO. | : 12/959980 |
| DATED | : February 26, 2013 |
| INVENTOR(S) | : Gaudin et al. |

It is certified that error appears in the above-identified patent and that said Letters Patent is hereby corrected as shown below:

In the Specifications

Column 5,
Line 21, "loan Mihai Miron et al." should read --Ioan Mihai Miron et al.--.

Column 9,
Line 28, "loan Mihai Miron et al." should read --Ioan Mihai Miron et al.--.

Signed and Sealed this
Twenty-eighth Day of May, 2013

Teresa Stanek Rea
*Acting Director of the United States Patent and Trademark Office*